United States Patent [19]

Nelson

[11] Patent Number: 4,468,284
[45] Date of Patent: Aug. 28, 1984

[54] PROCESS FOR ETCHING AN ALUMINUM-COPPER ALLOY

[75] Inventor: Norvell J. Nelson, Palo Alto, Calif.
[73] Assignee: Psi Star, Inc., Hayward, Calif.
[21] Appl. No.: 511,542
[22] Filed: Jul. 6, 1983
[51] Int. Cl.$^3$ .............................. C23F 1/02; B44C 1/22; C03C 15/00; C03C 25/06
[52] U.S. Cl. .................................. 156/643; 156/646; 156/656; 156/659.1; 156/665; 204/192 E; 252/79.1
[58] Field of Search ............. 156/643, 646, 656, 659.1, 156/665, 345; 252/79.1; 204/164, 192 E, 298; 427/38, 39

[56] References Cited

FOREIGN PATENT DOCUMENTS 0146939 12/1978 Japan ................................. 156/643

Primary Examiner—William A. Powell
Attorney, Agent, or Firm—Flehr, Hohbach, Test, Albritton & Herbert

[57] ABSTRACT

Plasma etching process for etching aluminum-copper alloys. The aluminum is reacted with a reactive chlorine specie, and the copper is oxidized by a nitrogen compound to form a $CuCl_2 \cdot Al_2Cl_6$ complex by which the copper is readily removed.

3 Claims, 1 Drawing Figure

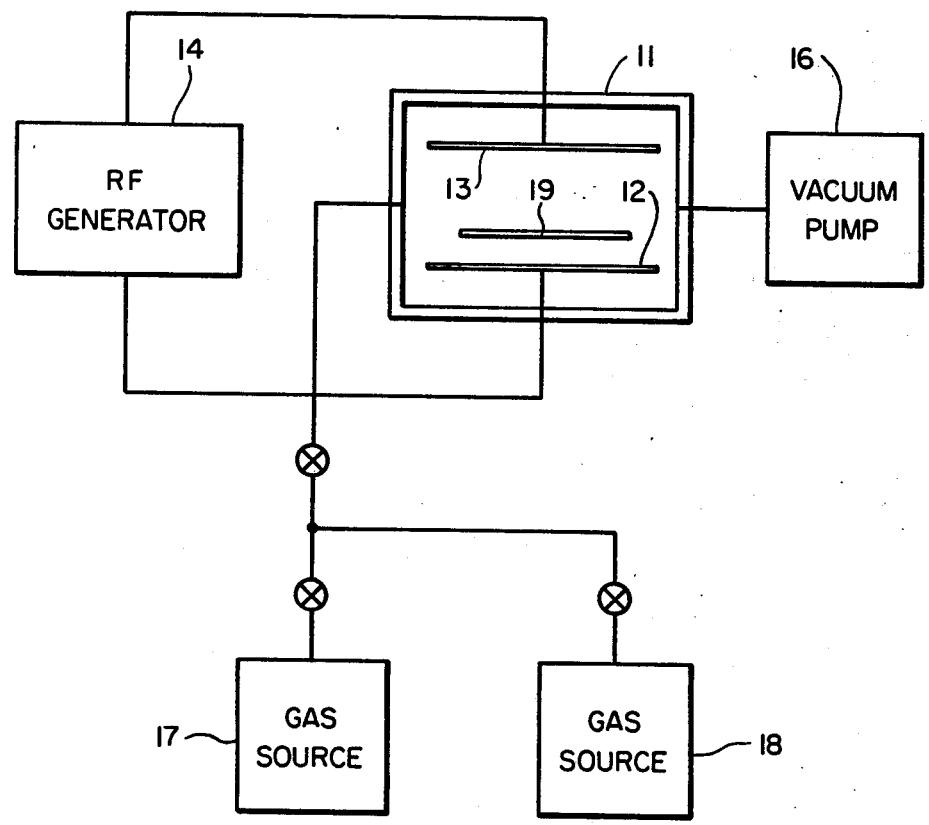

PROCESS FOR ETCHING AN ALUMINUM-COPPER ALLOY

This invention pertains generally to plasma etching processes, and more particularly to a process for etching aluminum-copper alloys containing up to about 6% copper by weight.

Aluminum can be readily and anisotropically etched with a reactive gas plasma at rates on the order of 1 micron per minute with line widths on the order of 1 micron or less. These geometries and rates are within the scope of those required by VLSI circuit technology and, hence, make plasma etching the preferred method of development of aluminum patterns on silicon wafers. Unfortunately, however, these desirable operating parameters are only achieved with pure aluminum layers, and aluminum-copper alloys have not been found to be etchable by a pure plasma process.

It is in general an object of the invention to provide a new and improved plasma etching process for etching aluminum-copper alloys.

Another object of the invention is to provide a process of the above character which is easy to carry out with existing systems for etching aluminum.

These and other objects are achieved in accordance with the invention by reacting the aluminum in the alloy with a reactive chlorine specie in a gas plasma and adding a nitrogen compound to the reactive plasma to oxidize the copper in the alloy and form a $CuCl_2 \cdot Al_2Cl_6$ complex by which the copper is readily removed. The nitrogen compound is added in the form of $NO$, $NO_2$ or $NOCl$ in an amount up to about 10% of the volume of the chlorine-containing gas.

The single FIGURE of drawing is a schematic diagram of one embodiment of a plasma reactor system for carrying out the process of the invention.

The basic chemistry of the aluminum etching process requires the reaction of the metal with a reactive chlorine specie to produce the volatile aluminum chloride dimer $Al_2Cl_6$ $$2Al + 6Cl \rightarrow Al_2Cl_6$$

which has a vapor pressure of about 1 atmosphere at 180° C. The direct reaction of aluminum and elemental chlorine to provide this dimer is a facile and rapid reaction which is favored both thermodynamically and kinetically. However, elemental chlorine is rarely used because its reaction with aluminum is isotropic, and it is not able to react with aluminum through the oxide layer which is usually present with aluminum. Consequently, other sources of reactive chloride are employed, most commonly $CCl_4$ and $BCl_3$.

Both $CCl_4$ and $BCl_3$ will produce a very reactive chlorine specie in the RF field, probably atomic chlorine Cl, which has more than enough energy to react with aluminum. The hetroatom, carbon or boron, is not merely a carrier for the chlorine, but also a necessary reagent specie in the reaction.

Either carbon or boron stripped of a number of Cl's can act as a getterer for the oxygen in the oxide layer on the aluminum. In either case, a volatile oxygen-containing product is produced, and the oxide layer is removed, exposing the underlying aluminum for reaction with the reactive chloride specie.

In addition, the hetroatom (particularly carbon) is believed to play an important role in promoting the anisotropic etching of aluminum and the straight wall etching geometry required for high density circuitry.

In order to remove copper as well as aluminum, it is necessary to convert the copper to a form having sufficient volatility for removal under the process conditions of the reactive plasma etch. Heretofore, however, it has been though that there were no volatile copper species at the temperature and pressures used in etching aluminum. This is true if one considers the available pure copper compounds of chlorine, that is, Cu(I) chloride (CuCl) and Cu(II) chloride ($CuCl_2$). Cu(I) chloride is the initial product that would be produced in the reaction between copper and a reactive gas plasma, and it has a vapor point of about $10^{-9}$ mm at 150° C., which is too low to permit a reasonable rate of transport. With Cu(III) chloride, the situation is even slightly worse since it has a vapor pressure of about $10^{-11}$ mm at 150° C. In addition, this compound tends to lose chlorine by decomposition to CuCl and $Cl_2$. At 150° C., the equilibrium pressure of $Cl_2$ over $CuCl_2$ is close to $10^{-8}$ mm, rising to about $10^{-6}$ mm at 200° C.

While pure copper chlorides do not have sufficient volatility to be useful for meaningful copper transport in a plasma process, other halides (e.g., compounds with boron and iodine) are even worse, having considerably lower vapor pressure and reduced stability of the Cu(II) specie.

While pure $CuCl_2$ has a vapor pressure that is too low to be useful for copper transport, it does form a complex with $Al_2Cl_6$ that has a reasonable vapor pressure at temperatures around 200°–220° C.:

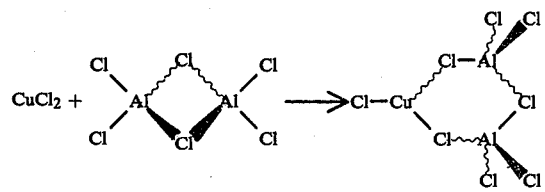

This complex has sufficient volatility to be readily detected in the gas phase at a reactant temperature of about 280° C. where it forms about 25% of the gas phase species.

Since the chemical potential of many of the Cl species in the reactive gas plasma used for etching aluminum is sufficient to also produce Cu(III) chloride, it may be questioned why the $CuCl_2$ product is not presently removed along with the $Al_2Cl_6$. Although the direct oxidation of copper with chlorine to produce $CuCl_2$ is thermodynamically favored, the reaction is often slow and will slow down drastically after a monolayer of CuCl is produced.

The problem of oxidizing copper to the +2 state is further complicated by the presence of carbon from the $CCl_4$ source used in the reaction. While carbon is necessary for the proper operation of the aluminum gas etching chemistry for oxide gettering and anisotropic etching, its presence virtually guarantees that copper will not be converted to the +2 state. It has been found that the presence of even small amounts of carbon monoxide completely inhibits the formation of $CuCl_2$ from Cu in systems having a Cl chemical potential sufficient to convert the Cu(II) to $CuCl_2$, and CO is undoubtedly present in aluminum etching plasmas using $CCl_4$.

Applicant has found that by adding $NO^+$ to the gas plasma, copper can be effectively converted to $CuCl_2$ to form the volatile $CuCl_2 \cdot Al_2Cl_6$ complex. As described in detail in copending application Ser. No. 450,685, filed Dec. 17, 1982, $NO^+$ is a key intermediate product in the oxidation of copper with nitrogen dioxide, and $NO^+$ is an extremely good reagent for removing electrons from copper. The inclusion of a NO specie has no deleterious effect upon the aluminum etching chemistry since aluminum is quite indifferent to reaction with these reagents.

$NO^+$ is conveniently provided by adding NO, $NO_2$ or NOCl to the reactive gas plasma. If chlorine atoms (either Cl or $Cl_2$) are present in reasonable amounts, the addition of nitric oxide to the gas mixture will cause the formation of nitrosyl chloride (NOCl):

$$NO + Cl \rightleftharpoons NOCl$$

$$NO + Cl_2 \rightleftharpoons NOCl + Cl$$

In the presence of aluminum chloride, a strong Lewis acid, NOCl ionizes completely to $NO^+$ and $Cl^-$:

$$NOCl + AlCl_3 \rightleftharpoons NO^+ + AlCl_4^-$$

With the generation of $NO^+$, all copper species are rapidly oxidized to $Cu^{2+}$, giving $CuCl_2$ ready for removal by complexing with the aluminum chloride.

If, for some reason, NO fails to promote the oxidation of all of the copper, different nitrogen oxide species can be used to effect oxidation of the copper. For example, nitrogen dioxide can be used directly to oxidize the copper if a suitable promoter is present. Reaction of $NO_2$ with copper is fairly rapid in the presence of zinc chloride (a weaker Lewis acid than aluminum chloride), and this reagent can be used if NO does not work. However, NO is preferred since $NO_2$ produces products other than chlorides which may have to be converted to chlorides before volatization.

If both NO and $NO_2$ fail to work, preformed NOCl can be used. Its main disadvantage is that it is highly corrosive, much more so than NO, $NO_2$ or $Cl_2$.

Suitable gases containing an active chlorine specie include $BCl_3$, $SiCl_4$, $CHCl_3$, $CCl_4$ and combinations thereof. One presently preferred gas mixture contains $BCl_3$ at a pressure on the order of 100–190 microns, $Cl_2$ at a pressure on the order of 100–190 microns and $SiCl_4$ at a pressure on the order of 190–300 microns. The $BCl_3$ is introduced into the reaction chamber at a flow rate of about 50–200 sccm, the $Cl_2$ is introduced at a flow rate of about 90–200 sccm, and the $SiCl_4$ is introduced at a flow rate of about 500–1500 sccm.

Referring now to the drawing, the process is carried out in a plasma reactor system comprising a reaction chamber 11 having a removable closure (not shown). A pair of generally parallel, planar electrodes 12, 13 are mounted in the reaction chamber and connected to a RF generator 14. The generator operates at a frequency of 13.56 MHz and produces a power density on the order of 1–10 watts/cm$^3$ between the electrodes. A vacuum pump 16 is connected to the chamber for exhausting gases therefrom, and a chlorine containing gas and a gas containing a nitrogen compound are supplied to the chamber from sources 17, 18. The material 19 to be etched is placed on a suitable holder between the electrodes and can, for example, rest on the lower electrode.

Operation and use of the apparatus, and therein the process of the invention, is as follows. The aluminum-copper alloy is placed in the reaction chamber, the door is closed, and the vacuum pump is actuated to reduce the pressure in the chamber to a desired level. The chlorine containing gas is admitted to the chamber from source 17, and the electrodes are energized to ionize the gas and form a reactive plasma. The gas containing a nitrogen compound is added to the plasma from source 18 at a flow rate up to about 10% of the flow rate from source 17. When the etching operation is completed, the gas is turned off, the electrodes are deenergized, the chamber is purged with an inert gas, and the etched material is removed.

When photoresist is employed to form a pattern in the aluminum-copper alloy, an inert gas such as helium or argon can be added to cool the plasma and protect the photoresist. With the preferred chlorine containing gas mixture discussed above, for example, the inert gas can be introduced at a flow rate of about 500–1500 sccm and maintained at a pressure of about 800–2000 microns in the reaction chamber.

EXAMPLE

An aluminum-copper alloy covered in part with a 1.1 micron thick layer of AZ 1370 photoresist is placed in a reactor between a pair of generally circular electrodes separated by a distance on the order of 2.5 cm. A gas mixture containing $BCl_3$, $Cl_2$ and $SiCl_4$ is introduced into the reaction chamber. The $BCl_3$ is introduced at a flow rate of 50–200 sccm and is present at a pressure of 100–190 microns, the $Cl_2$ is introduced at a flow rate of 90–200 sccm and is present at a pressure of 100–190 microns, and the $SiCl_4$ is introduced at a flow rate of 130–250 sccm and is present at a pressure of 190–300 microns. Helium is introduced at a flow rate of 500–1500 sccm and a pressure of 800–2000 microns, and gaseous NO is introduced at a flow rate on the order of 25–65 sccm or less. The electrodes are energized with RF energy at a frequency of 13.56 MHz to produce a power density of about 4 watts/cm$^3$ between the electrodes. The copper-aluminum alloy is removed at a rate on the order of 1–2 microns per minute.

It is apparent from the foregoing that a new and improved process for etching aluminum-copper alloys has been provided. While only certain presently preferred embodiments have been described in detail, as will be apparent to those familiar with the art, certain changes and modifications can be made without departing from the scope of the invention as defined by the following claims.

I claim:

1. In a process for etching an aluminum-copper alloy containing up to about 6% copper by weight, the steps of: reacting the aluminum with a reactive chlorine specie in a gas plasma to produce $Al_2Cl_6$, and including a source of $NO^+$ in the plasma to oxidize the copper to form $CuCl_2$ which combines with the $Al_2Cl_6$ to form $CuCl_2 \cdot Al_2Cl_6$.

2. The process of claim 1 wherein the source of $NO^+$ is selected from the group consisting of NO, $NO_2$, NOCl and combinations thereof.

3. The process of claim 1 wherein the reactive chlorine specie is provided by a gas selected from the group consisting of $BCl_3$, $SiCl_4$, $CHCl_3$, $CCl_4$, $Cl_2$ and combinations therof.

* * * * *